(12) United States Patent
Luo et al.

(10) Patent No.: US 7,875,543 B1
(45) Date of Patent: Jan. 25, 2011

(54) STRAIN-SILICON CMOS USING ETCH-STOP LAYER AND METHOD OF MANUFACTURE

(75) Inventors: Yuhao Luo, San Jose, CA (US); Deepak Kumar Nayak, Fremont, CA (US)

(73) Assignee: Xilinx, Inc., San Jose, CA (US)

(*) Notice: Subject to any disclaimer, the term of this patent is extended or adjusted under 35 U.S.C. 154(b) by 268 days.

(21) Appl. No.: 12/200,851

(22) Filed: Aug. 28, 2008

Related U.S. Application Data (62) Division of application No. 11/146,640, filed on Jun. 7, 2005, now Pat. No. 7,423,283.

(51) Int. Cl.
H01L 21/44 (2006.01)

(52) U.S. Cl. .................. 438/597; 438/270; 438/197; 257/E21.576; 257/E21.635; 257/E21.663

(58) Field of Classification Search .......... 438/197, 438/270, 637, 597, 634, 635, 733, 740, 753; 257/E21.576, 663, 635
See application file for complete search history.

(56) References Cited

U.S. PATENT DOCUMENTS

| | | | |
|---|---|---|---|
| 4,894,694 A | 1/1990 | Cham et al. | |
| 4,985,744 A | 1/1991 | Spratt et al. | |
| 5,650,340 A | 7/1997 | Burr et al. | |
| 5,696,012 A | 12/1997 | Son | |
| 5,854,509 A | 12/1998 | Kunikiyo | |
| 5,989,986 A | 11/1999 | Hsieh | |
| 5,989,992 A | 11/1999 | Yabu et al. | |
| 6,075,262 A | 6/2000 | Moriuchi et al. | |
| 6,157,064 A | 12/2000 | Huang | |
| 6,177,319 B1 | 1/2001 | Chen | |
| 6,262,445 B1 | 7/2001 | Swanson et al. | |
| 6,287,988 B1 | 9/2001 | Nagamine et al. | |
| 6,306,712 B1 | 10/2001 | Rodder et al. | |
| 6,399,973 B1 | 6/2002 | Roberds | |
| 6,541,343 B1 | 4/2003 | Murty et al. | |
| 6,563,152 B2 | 5/2003 | Roberds et al. | |
| 6,573,172 B1 | 6/2003 | En et al. | |
| 6,713,360 B2 | 3/2004 | Jain et al. | |
| 6,743,684 B2 | 6/2004 | Liu | |

(Continued)

OTHER PUBLICATIONS

A. Brand et al., "Intel's 0.25 Micron, 2.0Volts Logic Process Technology", Intel Technology Journal Q3 '98, pp. 1-9, available from Intel Corporation (Santa Clara) Corporate Office, 2200 Mission College Blvd., Santa Clara, California 95052-8119.

(Continued)

*Primary Examiner*—David Nhu
(74) *Attorney, Agent, or Firm*—Scott Hewett; Thomas George (57) ABSTRACT

Recesses are formed in the drain and source regions of an MOS transistor. An ohmic contact layer is formed in the recesses, and a stressed silicon-nitride layer is formed over the ohmic contact layer. The recesses allow the stressed silicon nitride layer to provide strain in the plane of the channel region. In a particular embodiment, a tensile silicon nitride layer is formed over recesses of an NMOS transistor in a CMOS cell, and a compressive silicon nitride layer is formed over recesses of a PMOS transistor in the CMOS cell. In a particular embodiment the stressed silicon nitride layer(s) is a chemical etch stop layer.

8 Claims, 5 Drawing Sheets

U.S. PATENT DOCUMENTS

| | | | |
|---|---|---|---|
| 6,870,179 | B2 | 3/2005 | Shaheed et al. |
| 6,906,393 | B2 | 6/2005 | Sayama et al. |
| 6,939,814 | B2 | 9/2005 | Chan et al. |
| 6,995,430 | B2 | 2/2006 | Langdo et al. |
| 7,022,561 | B2 | 4/2006 | Huang et al. |
| 7,052,964 | B2 | 5/2006 | Yeo et al. |
| 7,053,400 | B2 | 5/2006 | Sun et al. |
| 7,132,704 | B2 | 11/2006 | Grudowski |
| 7,138,309 | B2 | 11/2006 | Lee et al. |
| 7,193,254 | B2 | 3/2007 | Chan et al. |
| 7,208,362 | B2 | 4/2007 | Chidambaram |
| 7,256,084 | B2 | 8/2007 | Lim et al. |
| 7,259,105 | B2 | 8/2007 | Kim |
| 7,265,419 | B2 | 9/2007 | Minami |
| 7,288,448 | B2 | 10/2007 | Orlowski et al. |
| 7,314,793 | B2 * | 1/2008 | Frohberg et al. ............ 438/230 |
| 7,329,571 | B2 | 2/2008 | Hoentschel et al. |
| 7,423,283 | B1 | 9/2008 | Luo et al. |
| 7,429,775 | B1 | 9/2008 | Nayak et al. |
| 7,528,028 | B2 | 5/2009 | Liang et al. |
| 7,579,262 | B2 * | 8/2009 | Hoentschel et al. ......... 438/478 |
| 2005/0040460 | A1 | 2/2005 | Chidambarrao et al. |
| 2005/0136606 | A1 | 6/2005 | Rulke et al. |
| 2005/0247986 | A1 | 11/2005 | Ko et al. |
| 2005/0260817 | A1 | 11/2005 | Kim |
| 2005/0285187 | A1 | 12/2005 | Bryant et al. |
| 2006/0009041 | A1 | 1/2006 | Iyer et al. |
| 2006/0014350 | A1 | 1/2006 | Wang et al. |
| 2006/0046366 | A1 | 3/2006 | Orlowski et al. |
| 2006/0189167 | A1 | 8/2006 | Wang et al. |
| 2006/0244074 | A1 | 11/2006 | Chen et al. |
| 2006/0267106 | A1 | 11/2006 | Chao et al. |
| 2007/0001217 | A1 | 1/2007 | Chen et al. |
| 2007/0004123 | A1 | 1/2007 | Roberds |
| 2007/0010073 | A1 | 1/2007 | Chen et al. |
| 2007/0034963 | A1 | 2/2007 | Sudo |

OTHER PUBLICATIONS

U.S. Appl. No. 12/200,871, filed Aug. 28, 2008, Nayak et al., Xilinx, Inc. 2100 Logic Drive, San Jose, California.

Thompson, S. et al., "A 90 nm Logic Technology Featuring 50 nm strained silicon channel transistors, 7 layers of cu interconnects, low k ild, and 1 um2 sram cell", IEDM 2002, pp. 1-32, available from Intel Corporation, www.intel.com/research/silicon.

T. Ghani et al., "A 90nm High Volume Manufacturing Logic Technology Featuring Novel 45nm Gate Length Strained Silicon CMOS Transistors", IEEE, 2003, pp. 1-3, available from tahr.ghani@intel.com, or Intel Corporation (Santa Clara) Corporate Office, 2200 Mission College Blvd., Santa Clara, California 95052-8119.

Pidin, S. et al., "A Novel Strain Enhanced CMOS Architecture Using Selectively Deposited High Tensile and High Compressive Silicon Nitride Films", IEEE 2004, pp. 1-8, available from IEEE, 3 Park Avenue, 17th Floor, New York, NY 10016-5997.

Min Chin Chai, "90 nm Node CMOS Technology Comparison between Intel Corporation and Samsung Electronics", pp. 1-6, May 8, 2003, available from Intel Corporation (Santa Clara) Corporate Office, 2200 Mission College Blvd., Santa Clara, California 95052-8119.

Luo, Y. et al., "Enhancement of CMOS Performance by Process-Induced Stress", IEEE Transactions on Seminconductors Manufacturing, vol. 18, No. 1, Feb. 2005, pp. 63-68.

B. P. R. Chidambaram et al., "35% Drive Current Imporvement from Recessed-SiGe Drain Extensions on 37 nm Gate Length PMOS", 2004 Sumposium on VLSI Technology, Digest of Technical Papers, pp. 48-49, available from Texas Instruments, MS 3739, 13560 N. Central Expressway, Dallas, TX 75243.

A. Brand et al., pp. 1-9, available from Intel Corporation (Santa Clara) Corporate Office, 2200 Mission College Blvd., Santa Clara, California 95052-8119.

U.S. Appl. No. 11/224,566, Luo, Y. et al., filed Oct. 6, 2005, available from Xilinx Inc., 2100 Logic Drive, San Jose, CA 95124.

U.S. Appl. No. 11/221,507, Nayak, D.K. et al., filed Sep. 8, 2005, available from Xilinx Inc., 2100 Logic Drive, San Jose, CA 95124.

U.S. Appl. No. 11/146,640, Luo, Y. et al., filed Jun. 7, 2005, available from Xilinx Inc., 2100 Logic Drive, San Jose, CA 95124.

U.S. Appl. 11/095,814, Nayak, D. K., et al., filed Mar. 31, 2005, Xilinx, Inc. 2100 Logic Drive, San Jose, Ca 95124.

* cited by examiner

STRAIN-SILICON CMOS USING ETCH-STOP LAYER AND METHOD OF MANUFACTURE

CROSS-REFERENCE TO RELATED APPLICATION

This application is a divisional of Applicants' patent having U.S. Pat. No. 7,423,283, application Ser. No. 11/146,640, and filed Jun. 7, 2005.

FIELD OF THE INVENTION

The present invention relates generally to semiconductor devices, and more particularly to transistors having improved mobility due to channel strain.

BACKGROUND OF THE INVENTION

Programmable logic devices (PLDs) are a well-known type of integrated circuit (IC) that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

ICs use various sorts of devices to create logic circuits. Many types of ICs use complementary metal-oxide-semiconductor ("CMOS") logic circuits. CMOS logic circuits use CMOS cells that have a first-conductivity-type metal-oxide-semiconductor ("MOS") transistor (e.g., a p-type MOS ("PMOS") transistor) paired with a second-conductivity-type MOS transistor (e.g., an n-type MOS ("NMOS") transistor). CMOS cells can hold a logic state while drawing only very small amounts of current.

It is generally desirable that MOS transistors, whether used in a CMOS cell or used individually, provide good conductivity between the source and the drain of the MOS transistor when operating voltage is applied to the gate of the MOS transistor. In other words, it is desirable that current flows through the channel between the source and the drain when the MOS transistor is turned on.

The amount of current flowing through the channel of an MOS transistor is proportional to the mobility of charge carriers in the channel. Increasing the mobility of the charge carriers increases the amount of current that flows at a given gate voltage. Higher current flow through the channel allows the MOS transistor to operate faster. One of the ways to increase carrier mobility in the channel of a MOS transistor is to produce strain in the channel.

There are several ways to create strain in the channel region. One approach is to deposit stressed layers over a MOS transistor. Another approach is to modify existing structures, such as by implanting ions into the drain and source regions. Yet another approach is to grow stressed material in a recess of the source and/or drain region of a MOS transistor.

Figure 1A:
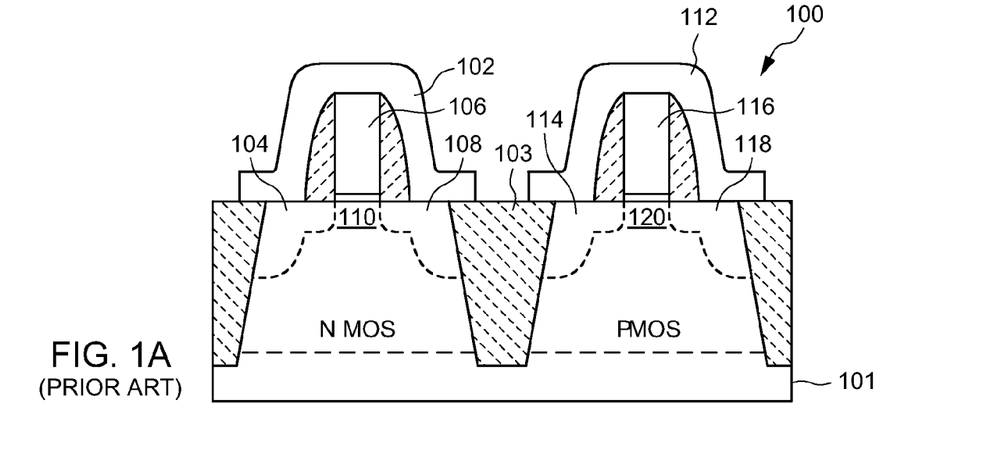
FIG. 1A is a simplified cross section of a prior art CMOS cell.

FIG. 1A is a simplified cross section of a prior art CMOS cell 100. The CMOS cell includes an NMOS transistor and a PMOS transistor fabricated on a silicon wafer substrate 101. The NMOS transistor is separated from the PMOS transistor by a dielectric-filled isolation trench 103. A tensile silicon nitride layer 102 overlies the source 104, gate 106 and drain 108 regions of the NMOS transistor, and a compressive silicon nitride layer 112 overlies the source 114, gate 116, and drain 118 regions of the PMOS transistor. The tensile silicon nitride layer 102 produces tensile strain in the channel 110 of the NMOS transistor, and the compressive silicon nitride layer 112 produces compressive strain in the channel 120 of the PMOS transistor, each of which enhances charge carrier mobility. The tensile silicon nitride layer is deposited and selectively etched, and then the compressive silicon nitride layer is deposited and selectively etched, or vice versa.

Figure 1B:
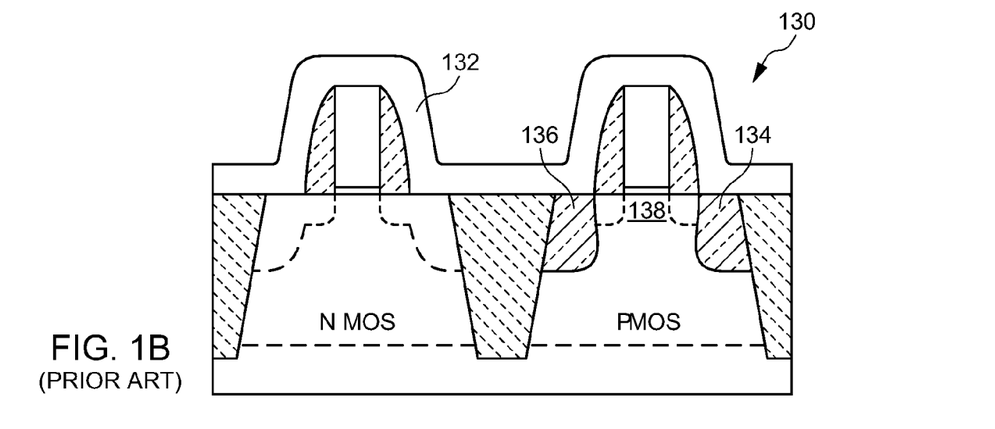
FIG. 1B is a simplified cross section of a prior art CMOS cell having a tensile silicon nitride layer formed over both the NMOS transistor and the PMOS transistor.

FIG. 1B is a simplified cross section of a prior art CMOS cell 130 having a tensile silicon nitride layer 132 formed over both the NMOS transistor and the PMOS transistor. The PMOS transistor includes silicon-germanium (SiGe) refilled source and drain 134, 136 formed by selective epitaxy in cavities etched into the source and drain regions of the PMOS transistor. The SiGe plugs provide compressive stress; however, the compressive strain provided to the channel 138 is undesirably reduced by the overlying tensile silicon nitride layer 132.

Figure 1C:
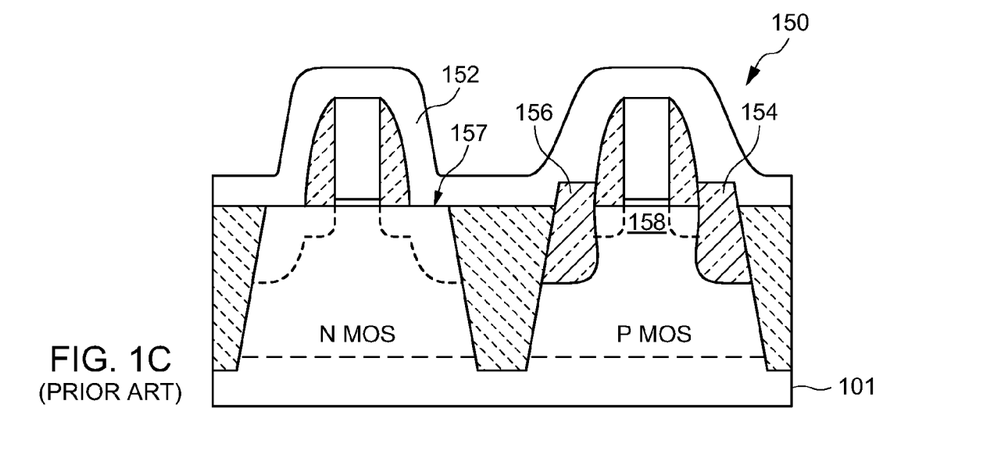
FIG. 1C is a simplified cross section of a prior art CMOS cell having a tensile silicon nitride layer formed over both the NMOS transistor and the PMOS transistor, and having extended SiGe plugs.

FIG. 1C is a simplified cross section of a prior art CMOS cell 150 having a tensile silicon nitride layer 152 formed over both the NMOS transistor and a PMOS transistor, and having extended SiGe plugs 154, 156. The extended SiGe plugs 154, 156 are epitaxially grown to extend above the original surface 157 of the silicon wafer substrate 101. This provides additional compressive stress and also moves the tensile silicon nitride layer 152 further from the channel 158 of the PMOS transistor, thus avoiding some of the reduction of strain that occurs in the PMOS transistor of FIG. 1B.

However, growing SiGe by selective epitaxy requires process steps outside of normal CMOS fabrication techniques, which complicates fabrication. Furthermore, growing the epitaxial SiGe typically involves removing a CMOS wafer from the process stream, which increases the possibility of contamination and defect formation. While the silicon nitride films of FIG. 1A provide some level of tensile and compressive strain, higher strains are desirable to further improve carrier mobility.

SUMMARY OF THE INVENTION

Recesses are formed in the drain and source regions of an MOS transistor. An ohmic contact layer is formed in the recesses, and a stressed silicon-nitride layer is formed over the ohmic contact layer. The recesses allow the stressed silicon nitride layer to provide strain in the plane of the channel region. In a particular embodiment, a tensile silicon nitride layer is formed over recesses of an NMOS transistor in a CMOS cell, and a compressive silicon nitride layer is formed over recesses of a PMOS transistor in the CMOS cell. In a particular embodiment the stressed silicon nitride layer(s) is a chemical etch stop layer.

DETAILED DESCRIPTION OF THE DRAWINGS

I. Exemplary Transistors

Figure 2A:
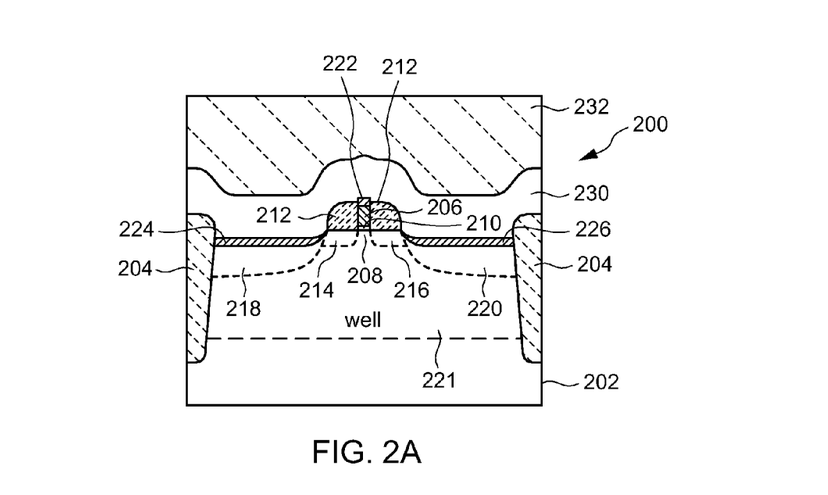
FIG. 2A is a simplified cross section of an MOS transistor according to an embodiment of the invention.

FIG. 2A is a simplified cross section of an MOS transistor 200 according to an embodiment of the invention. The MOS transistor 200 is fabricated on a substrate 202, such as a silicon wafer or a silicon-on-insulator (SOI) wafer. In an IC, many transistors are fabricated on a piece of the substrate, commonly called a die or chip. Transistors on a chip are often separated by trench isolation dielectric 204 or other isolation structures.

A gate 206 is isolated from a channel 208 by a gate dielectric layer 210. Sidewall spacers 212 align lightly-doped regions 214, 216 with the source 218 and drain 220. The source 218, drain 220, channel 208, and lightly-doped regions 214, 216 are formed in a well 221 of the substrate 202. The well 221 is a P-well or N-well depending on whether the MOS transistor is an NMOS or PMOS transistor. The gate 206 is typically made of silicon (e.g., poly silicon), and an ohmic contact layer, such as a silicide layer, 222 is formed over the gate silicon. Ohmic contact layers 224, 226, such as silicide layers, are similarly formed over the source 218 and drain 220 to facilitate electrically coupling these regions using metal traces or vias.

The ohmic contact layers 224, 226 are formed in recesses (see FIG. 3B, ref. num. 320, 322) over the source 218 and drain 220 regions. A stressed silicon nitride layer 230 covers the MOS transistor from the source region to the drain region and fills the recesses. If the MOS transistor is an NMOS transistor, the stressed silicon nitride layer is a tensile layer, and if the MOS transistor is a PMOS transistor, the stressed silicon nitride layer is a compressive layer. This produces tensile and compressive strain, respectively, in the channel of the MOS transistor. Forming a recess that results in the bottom of the stressed silicon nitride layer to be beneath the top of the channel allows the stress to be applied directly across the channel (i.e., in the direction between the source and the drain). This in turn produces greater strain in the silicon of the channel, improving carrier mobility.

Silicon nitride layers are typically used in CMOS fabrication sequences, so no new process steps, such as selective epitaxial growth of SiGe used in prior art devices, need to be added. The wafer does not have to be removed from the CMOS production sequence, which reduces yield loss due to contamination. In a particular embodiment, the stressed silicon nitride layer is an etch stop layer provided between the MOS transistor and an overlying inter-metal dielectric ("IMD") layer 232. An IMD layer is typically deposited as a relatively thick layer, and subsequently flattened and reduced to a final thickness using a chemical-mechanical polish ("CMP") technique. The silicon nitride cap layer is used as an etch-stop layer when etching vias through the IMD layer, for example. In a further embodiment, the IMD layer 232 is also a stressed layer. For example, the stressed silicon nitride layer is a compressive layer and the IMD layer is also a compressive layer, or both layers are tensile layers. Alternatively, the IMD layer has a first type of stress (e.g., compressive or tensile), and the stressed silicon nitride layer has a second type of stress (e.g., tensile or compressive). Stress in IMD layers can be induced by ion implantation, for example, so that a single IMD layer can be deposited, and stress induced in selected areas of the IMD layer.

Figure 2B:
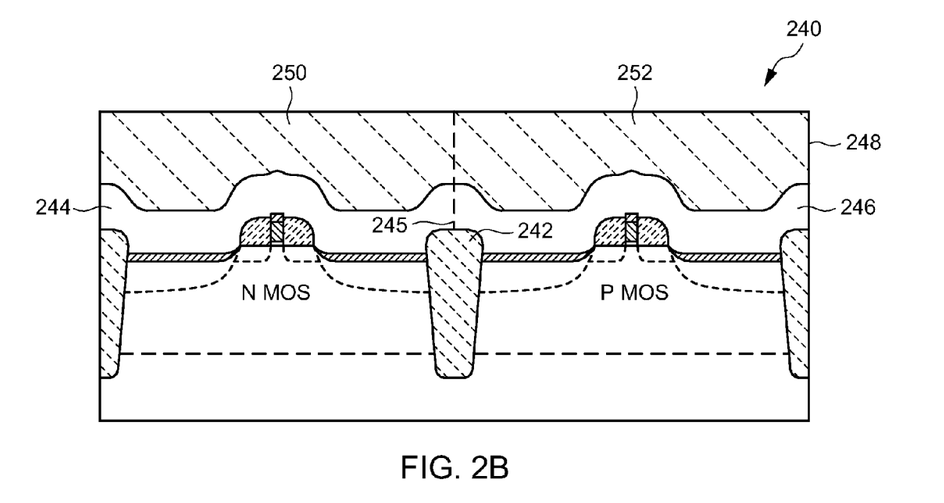
FIG. 2B is a simplified cross section of a CMOS cell according to an embodiment of the invention.

FIG. 2B is a simplified cross section of a CMOS cell 240 according to an embodiment of the invention. The CMOS cell 240 includes an NMOS transistor and a PMOS transistor separated by a dielectric-filled isolation trench 242. Each of the NMOS transistor and PMOS transistor is similar to the MOS transistor of FIG. 2A and a detailed description of each half of the CMOS cell is omitted. However, a tensile silicon nitride layer 244 is formed over the NMOS transistor and a compressive silicon nitride layer 246 is formed over the PMOS transistor.

An IMD layer 248 is typically formed over the stressed SiN layers 244, 246. In one embodiment, the IMD layer is a neutral-stress layer. In another embodiment the IMD layer is a compressive-stress layer or a tensile-stress layer. In yet another embodiment, the IMD layer has a tensile portion 250 overlying the tensile SiN layer and a compressive portion 252 overlying the compressive SiN layer. For example, the IMD layer is deposited as a tensile layer, and selectively converted to a compressive layer over the PMOS cells, such as by ion implantation using the P-well mask, or vice versa. Alternatively, the IMD layer is deposited as a neutral-stress layer, and portions are converted to provide compressive and/or tensile stress.

The N-well mask may be used to define the tensile and compressive silicon nitride layers. Alternatively, a P-well mask may be used. These layers are shown as being continuous, separated by a border represented by dashed line 245. In practice, a small gap or overlap may occur due to mask alignment tolerances. Alternatively, an additional mask is used to form tensile and compressive silicon nitride layers that are separated from each other; however, using the N-well mask (or P-well mask) advantageously insures that stressed silicon nitride is formed over the entire source and drain regions and avoids having to generate the additional mask. Additionally when the stressed silicon nitride layer extends to at least the dielectric-filled isolation trench, the portion of the stressed silicon nitride layer in the recess (see FIG. 3B, ref. nums. 320, 322) pushes against the trench dielectric opposite the channel region.

An Exemplary Process Flow

Figure 3A:
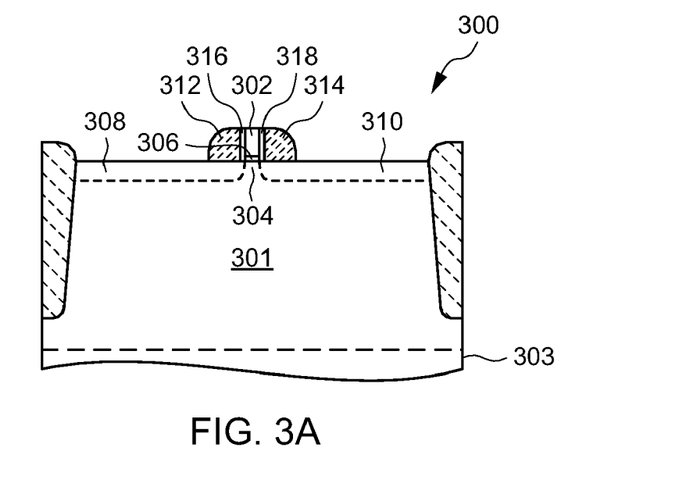
FIGS. 3A-3F are a series of cross sectional views illustrating steps of forming a transistor according to an embodiment of the invention.

FIGS. 3A-3F are a series of cross sectional views illustrating steps of forming a transistor according to an embodiment of the invention. FIG. 3A shows a cross section of a partially fabricated transistor 300, which in this example is a MOS transistor, such as a PMOS transistor or an NMOS transistor. A well 301, such as a P-well or an N-well, has been fabricated in the substrate 303, which is a silicon wafer, silicon-on-insulator wafer, or similar substrate. A gate 302 is separated from a channel region 304 by a gate dielectric layer 306. "Lightly doped drain" ("LDD") regions 308, 310 have been formed in source and drain areas. First sidewall spacers 316, 318 have been formed adjacent to gate 302. Second sidewall spacers 312, 314 have been formed on first sidewall spacers 316, 318. Alternatively, first sidewall spacers are omitted.

Figure 3B:
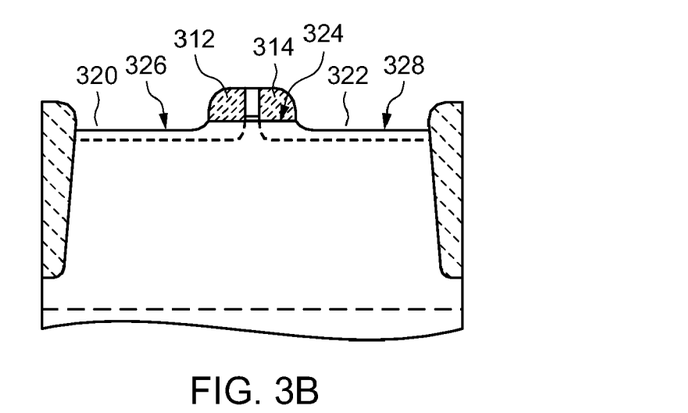

FIG. 3B shows the partially fabricated transistor with recesses 320, 322. The recesses remove silicon from the source/drain regions below the original surface 324 of the substrate. In other words, the surfaces 326, 328 of the recesses are below the original surface 324 of the substrate. The recesses 320, 322 are aligned to the second sidewall spacers 312, 314 and etched to a depth that does not extend through the LLD regions. Alternatively, the recesses are etched through the LDD regions. In a particular embodiment, the recesses are formed using an anisotropic silicon etch process that aligns the sidewall of the recess with the edge of the outermost sidewall spacer.

Figure 3C:
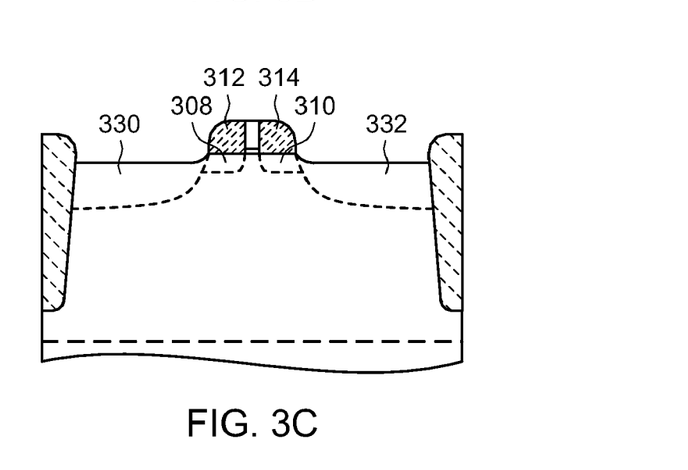

FIG. 3C shows the partially fabricated transistor after the source/drain implant and drive-in. The source/drain implant forms source and drain regions 330, 332 that are more highly doped than the LDD regions 308, 310.

Figure 3D:
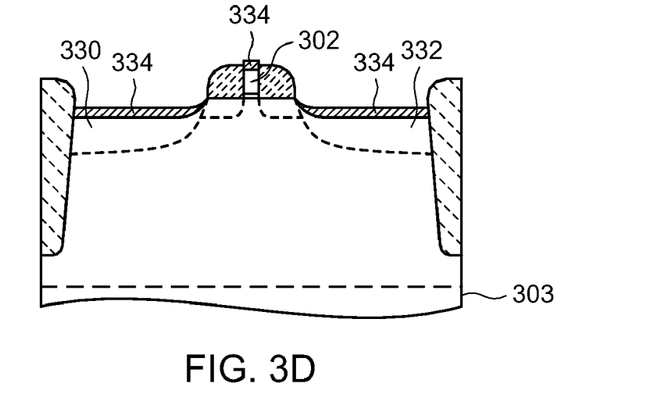

FIG. 3D shows the partially fabricated transistor after a silicidation or other ohmic contact process. In a particular embodiment, an ohmic contact layer 334 is a silicide layer formed on areas of exposed silicon, including the polysilicon gate 302, and the source and drain regions 330, 332. The silicide layer provides a reliable, non-rectifying electrical contact from the underlying silicon to an overlying metal layer(s) (not shown). Other types of ohmic contact layers are alternatively used.

Figure 3E:
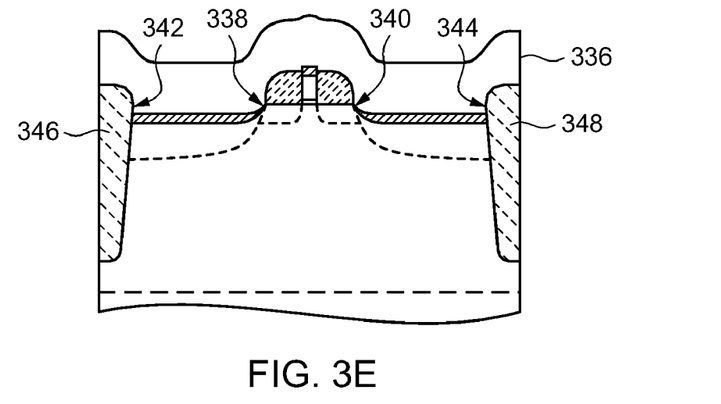

FIG. 3E shows the partially fabricated transistor after a stressed silicon-nitride ("SiN") layer 336 has been formed over the transistor. The stressed SiN layer 336 is formed so as to have a residual stress that induces strain that promotes carrier mobility in the channel region 304. For example, if the transistor is an NMOS transistor, the stressed SiN layer is formed to have residual tensile stress, producing tensile strain in the channel region, and if the transistor is a PMOS transistor, the stressed SiN layer is formed to have residual compressive stress, producing compressive strain in the channel region.

The SiN layer 336 fills the recesses (see FIG. 3B, ref. nums. 320, 322). This provides stressed layers on opposite sides of the channel region 304. In particular, the SiN layer 336 pulls (if tensile) or presses against (if compressive) the sidewalls 338, 340 of the silicon exposed when the recesses were formed. This transfers stress in the desired plane, namely across the channel region 304, compared to a conventional stress layer that sits on top of the original surface of the silicon wafer (refer to FIG. 3B, ref. num. 324). Note that in FIG. 3A, the isolation dielectric extends above the original surface of the silicon wafer; however, by virtue of forming the recesses, the stressed SiN layer would pull/push against the sidewalls of the isolation dielectric even if the top of the isolation dielectric was even with the original surface of the silicon wafer. In a particular embodiment, the stressed SiN layer also serves as a chemical etch-stop layer ("CESL").

CESLs are included in many CMOS fabrication sequences to provide a barrier to an etch through an overlying IMD layer, which is typically a very thick (relative to other layers in the MOS transistor) layer of silicon oxide. Thus, forming a stressed SiN CESL, rather than a conventional SiN CESL, provides the advantage of increased carrier mobility in the channel region without adding another process, although the SiN deposition process is varied slightly to produce SiN layers having the desired type of stress. This is desirable because it avoids contamination problems that can arise when other stress-forming techniques, such as selective epitaxial growth, are used that are not normally part of a CMOS process flow.

Figure 3F:
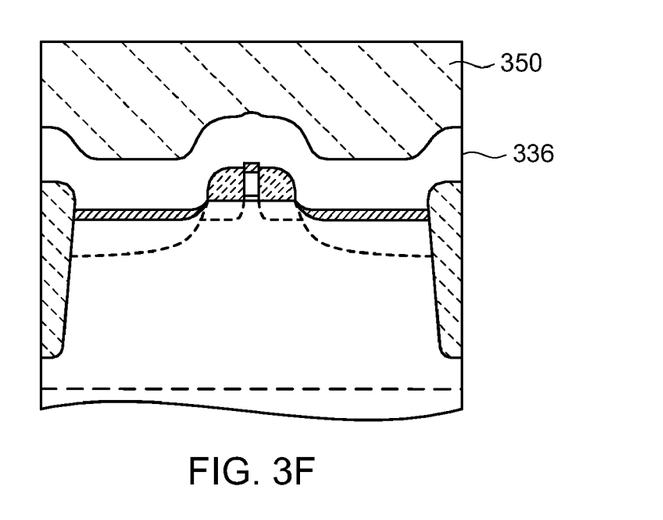

FIG. 3F shows the partially fabricated transistor after an IMD layer 350 has been formed over the stressed SiN layer 336. In a particular embodiment, the IMD layer is a stressed layer. Alternatively, the IMD layer does not have significant residual stress. A stressed IMD layer can have the same type of stress (e.g., tensile or compressive) as the underlying stressed SiN layer, or can have the opposite type of stress as the underlying stressed SiN layer.

Exemplary Methods

Figure 4A:
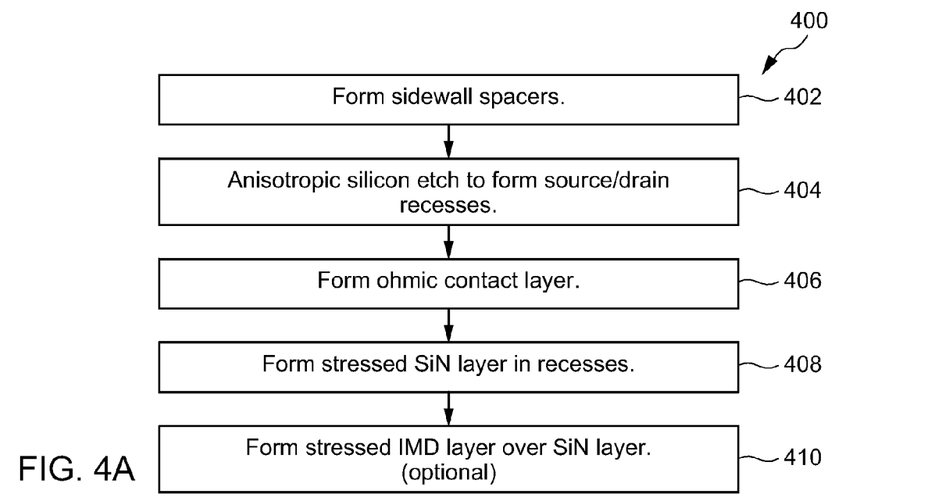
FIG. 4A is a flow chart of a method of fabricating a MOS transistor according to an embodiment of the invention.

FIG. 4A is a flow chart of a method of fabricating a MOS transistor 400 according to an embodiment of the invention. The terms "PMOS transistor" and "NMOS transistor" are used for simplicity of illustration to describe a device during any portion of its fabrication sequence, as well as the finished transistors. Many common steps familiar to those of skill in the art of MOS transistor fabrication are omitted for clarity of discussion. Sidewall spacers are formed on the sides of a gate (step 402). In a particular embodiment, the sidewall spacers are oxide spacers having a thickness between about 5 nanometers and about 200 nanometers. An anisotropic silicon etch is performed in the source and drain regions of the MOS transistor (step 404) to form recesses. The anisotropic silicon etch is self-aligned to the sidewall spacers. In a particular embodiment, the recesses are etched to a depth of between about 5 nanometers and about 50 nanometers. An isotropic etch is optionally performed if undercutting of the first sidewall spacers is desired. A halo implant, extension implant, and/or LDD implant are typically performed before the recesses are etched, but are alternatively performed after the recesses are etched. The halo implant is more localized than in a conventional device without recesses, whether it is performed before or after formation of the recesses, as long as halo thermal activation is after the formation of the recesses. This localized halo improves short channel effect and device performance.

An ohmic contact layer is formed over the source and drain regions (step 406), and typically also over the gate at the same time. In a particular embodiment, the ohmic contact layer is a silicide layer formed by depositing a suitable silicide-forming metal, followed by a thermal treatment. A stressed SiN layer is formed over at least the portions of the recesses adjacent to the gate (step 408), and typically over essentially the entire transistor, so as to fill the recesses above the ohmic contact layer with stressed SiN. In a particular embodiment, the stressed SiN layer is about 40 nanometers to about 150 nanometers thick and also serves as a CESL. In general, the SiN layer is sufficiently thick and sufficiently stressed so as to provide an increase in carrier mobility. The degree to which carrier mobility is selectively enhanced depends on the type of device and its intended application. Filling the recesses with stressed SiN produces a desirable strain in the channel region between the recesses that improves carrier mobility between the recesses. In a further embodiment, an IMD layer is formed over the stressed SiN layer (step 410). In a particular embodiment, the IMD layer is a second stressed layer.

Figure 4B:
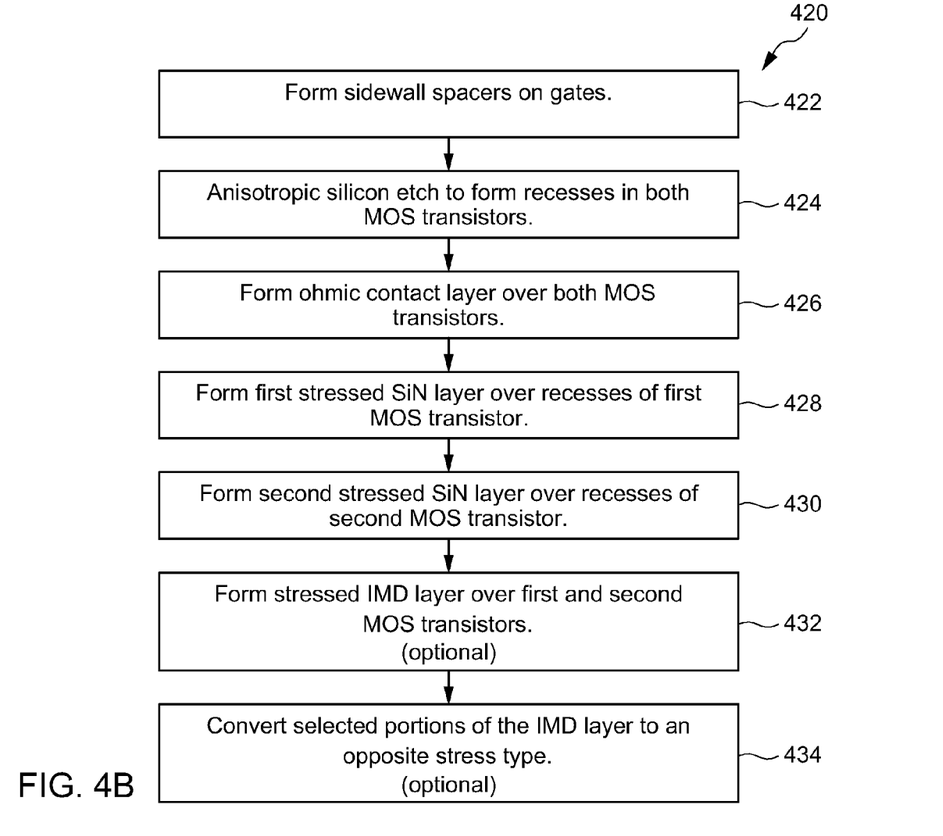
FIG. 4B is a flow chart of a method of fabricating a CMOS cell according to an embodiment of the invention.

FIG. 4B is a flow chart of a method of fabricating a CMOS cell 420 according to an embodiment of the invention. Many common steps familiar to those of skill in the art of MOS transistor fabrication are omitted for clarity of discussion. Sidewall spacers are formed on the sides of the gates (step 422). In a particular embodiment, the sidewall spacers are oxide spacers having a thickness between about 5 nanometers and about 200 nanometers. An anisotropic silicon etch is performed in the source and drain regions of both MOS transistors (step 424) to form recesses. The anisotropic silicon etch is self-aligned to the sidewall spacers on each device. In a particular embodiment, the recesses are etched to a depth of between about 5 nanometers and about 50 nanometers. An isotropic etch is optionally performed if undercutting of the first sidewall spacers is desired. Halo implants, extension implants, and/or LDD implants are typically performed before the recesses are etched, but are alternatively performed after the recesses are etched. The halo implants are more localized than in a conventional device without recesses, whether it is performed before or after formation of the recesses, as long as halo thermal activation is after the formation of the recesses. This localized halo improves short channel effect and device performance.

An ohmic contact layer is formed over the source and drain regions of both MOS transistors (step 426), and typically also over the gates at the same time. In a particular embodiment, the ohmic contact layer is a silicide layer formed by depositing a suitable silicide-forming metal, followed by a thermal treatment. A first stressed SiN layer having a first stress type (e.g., tensile or compressive) is formed over at least the portions of the recesses adjacent to the gate of a first MOS transistor (step 428) so as to fill the portions of the recesses next to the gate of the first MOS transistor above the ohmic contact layer with a first type of stressed SiN. For example, the first MOS transistor is the PMOS portion of the CMOS cell, and the first stressed SiN layer is a compressive SiN layer. Alternatively, the first MOS transistor is the NMOS portion of the CMOS cell and the first stressed SiN layer is a tensile SiN layer. In a particular embodiment, the N-well mask is used to define where the first stressed SiN layer is deposited. In a particular embodiment, the first stressed SiN layer is about 40 nanometers to about 150 nanometers thick and also serves as a CESL.

A second stressed SiN layer having a second stress type (e.g., compressive or tensile) opposite the first stress type is formed over at least the portions of the recesses next to the gate of the second MOS transistor (step 430), and typically over essentially the entire transistor, so as to fill the portions of the recesses next to the gate above the ohmic contact layer with a second type of stressed SiN. In a particular embodiment, the second stressed SiN layer is about 40 nanometers to about 150 nanometers thick and also serves as a CESL. In a particular embodiment, the second stressed SiN layer and the adjoining first stressed SiN layer overlie isolation dielectric.

Filling the recesses of both MOS transistors in the CMOS cell with appropriately stressed SiN produces a desirable strain in the channel region between the recesses that improves carriers mobility between the recesses. In a further embodiment, an IMD layer is formed over the stressed SiN layer (step 432). In a particular embodiment, the IMD layer is a stressed IMD layer having a first selected type of stress. In a further embodiment, selected portions of the stressed IMD layer are converted to a second selected type of stress (step 434).

While the present invention has been described in connection with specific embodiments, variations of these embodiments will be obvious to those of ordinary skill in the art. For example, photo-masks other than the N-well masks are used in alternative embodiments so that the stressed SiN layer does not extend all the way to the isolation dielectric. Therefore, the it and scope of the appended claims should not be limited to the foregoing description.

We claim:

1. A method of fabricating a transistor comprising:
    forming sidewall spacers on a gate;
    etching silicon in source and drain regions to form recesses below an original surface of the silicon;
    forming an ohmic contact layer over the source and drain regions; and
    forming a stressed silicon nitride layer in the recesses over at least portions of the ohmic contact layer proximate to the gate.

2. The method of fabricating a transistor according to claim 1 wherein the step of etching silicon comprises an anisotropic silicon etch.

3. The method of fabricating a transistor according to claim 1 wherein the step of forming the ohmic contact layer includes sub-steps of
    depositing a layer of silicide-forming material, and
    thermally treating the transistor to form a silicide layer.

4. The method of fabricating a transistor according to claim 1 wherein the sidewall spacers comprise an oxide having a thickness of between about 5 nanometers and about 200 nanometers.

5. The method of fabricating a transistor according to claim 1 wherein the recesses are etched to a depth of between about 5 nanometers and about 50 nanometers.

6. The method of fabricating a transistor according to claim 1 wherein the stressed silicon nitride layer forms a chemical etch stop layer.

7. The method of fabricating a transistor according to claim 1 wherein the transistor is portion of a complementary metal-oxide-semiconductor ("CMOS") cell having a second transistor, and the stressed silicon nitride layer has a first stress type, and further comprising:
    forming a second stressed silicon nitride layer having a second stress type over the second transistor.

8. The method of fabricating a transistor according to claim 7 wherein the stressed silicon nitride layer and the second stressed silicon nitride layer form a chemical etch stop layer.

* * * * *